(12) United States Patent
Dunton et al.

(10) Patent No.: US 7,238,607 B2
(45) Date of Patent: Jul. 3, 2007

(54) METHOD TO MINIMIZE FORMATION OF RECESS AT SURFACE PLANARIZED BY CHEMICAL MECHANICAL PLANARIZATION

(75) Inventors: Samuel V. Dunton, San Jose, CA (US); S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/237,169

(22) Filed: Sep. 28, 2005

(65) Prior Publication Data

US 2006/0054962 A1  Mar. 16, 2006

Related U.S. Application Data

(63) Continuation-in-part of application No. 10/855,784, filed on May 26, 2004, now Pat. No. 6,952,030, which is a continuation of application No. 10/326,470, filed on Dec. 19, 2002, now abandoned, and a continuation-in-part of application No. 11/125,606, filed on May 9, 2005.

(51) Int. Cl.
*H01L 21/4763* (2006.01)

(52) U.S. Cl. ............... 438/626; 438/627; 438/645; 438/618; 438/692

(58) Field of Classification Search ........... 438/257, 438/593, 626–631, 641–645; 257/314–316
See application file for complete search history.

(56) References Cited

U.S. PATENT DOCUMENTS 5,700,737 A * 12/1997 Yu et al. .................. 438/636
6,611,453 B2 * 8/2003 Ning ........................ 365/171

* cited by examiner

*Primary Examiner*—Dung A. Le
(74) *Attorney, Agent, or Firm*—Vierra Magen Marcus & DeNiro LLP

(57) ABSTRACT

When chemical mechanical planarization (CMP) is used to planarize a surface coexposing patterned features and dielectric fill, where patterned features and the fill are formed of materials having very different CMP removal rates or characteristics, the planarized surface may have excessively rough, dishing or recessing may take place, or one or more or the materials may be damaged. In structures in which planarity is important, these problems can be prevented by forming a capping layer on the patterned features, wherein the CMP removal rate of the material forming the capping layer is similar to the CMP removal rate of the dielectric fill.

19 Claims, 8 Drawing Sheets

METHOD TO MINIMIZE FORMATION OF RECESS AT SURFACE PLANARIZED BY CHEMICAL MECHANICAL PLANARIZATION

RELATED APPLICATIONS

This application is a continuation-in-part of Herner et al., U.S. patent application Ser. No. 10/855,784, "An Improved Method for Making High-Density Nonvolatile Memory," filed May 26, 2004 now U.S. Pat No. 6,952,030, which is a continuation of Herner et al., U.S. patent application Ser. No. 10/326,470, "An Improved Method for Making High-Density Nonvolatile Memory," filed Dec. 19, 2002 (since abandoned) and hereinafter the '470 application, both assigned to the assignee of the present invention and hereby incorporated by reference in their entirety. This application is also a continuation-in-part of Herner et al., U.S. patent application Ser. No. 11/125,606, "High-Density Nonvolatile Memory Array Fabricated at Low Temperature Comprising Semiconductor Diodes," filed May 9, 2005, hereinafter the '606 application and hereby incorporated by reference.

BACKGROUND OF THE INVENTION

The invention relates to a method to improve planarity of a planarized surface.

Different materials have different removal rates during chemical mechanical planarization. When a surface is planarized, and when that surface has two materials having different removal rates coexposed, one material tends to become dished or recessed relative to the other. In some cases, when two materials having unlike polishing properties are exposed together, one material may be damaged, resulting in surface roughness. In structures in which planarity is important, such dishing, recessing, or surface damage is disadvantageous.

There is an advantage, therefore, in a method to reduce or prevent dishing, recessing, or damage at such a surface.

SUMMARY OF THE PREFERRED EMBODIMENTS

The present invention is defined by the following claims, and nothing in this section should be taken as a limitation on those claims. In general, the invention is directed to a method to form a planarized surface exposing unlike materials which avoids dishing, recess, or roughness due to damage.

A first preferred embodiment of the invention provides for method for planarizing a surface, the method comprising: depositing aluminum or an aluminum alloy; depositing a second conductive material on the aluminum or aluminum alloy; patterning and etching the second conductive material and the aluminum or aluminum alloy to form patterned features; depositing a dielectric material over and between the patterned features; and polishing by a CMP process to coexpose the second conductive material and the dielectric material at a planarized surface, the CMP process adapted to remove the dielectric material, wherein, during the polishing step, a removal rate of the second conductive material is between 50 percent and 150 percent of a removal rate of the dielectric fill.

Another preferred embodiment of the invention provides for a method for forming a surface coexposing patterned features and dielectric material, the method comprising: forming first features of a first conductive material and a conductive capping material on the first conductive material; forming dielectric fill between the first features; and polishing by CMP to coexpose the dielectric fill and the conductive capping material, wherein, during the polishing step the first conductive material has a lower removal rate than the conductive capping material.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
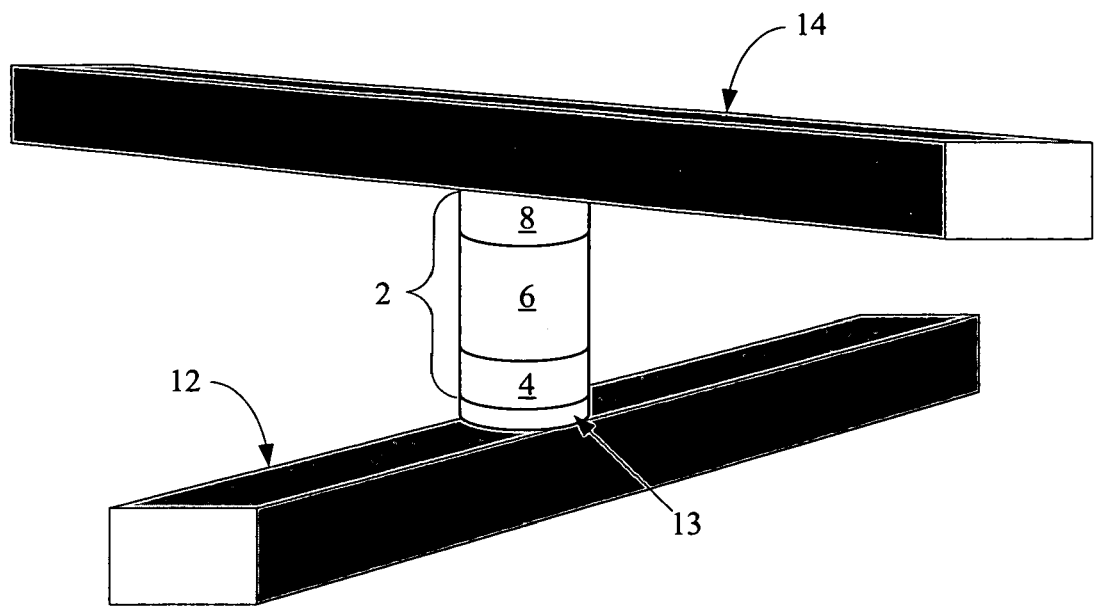
FIG. 1 is perspective view of a three dimensional memory cell formed according to the '470 application.
Figure 2:
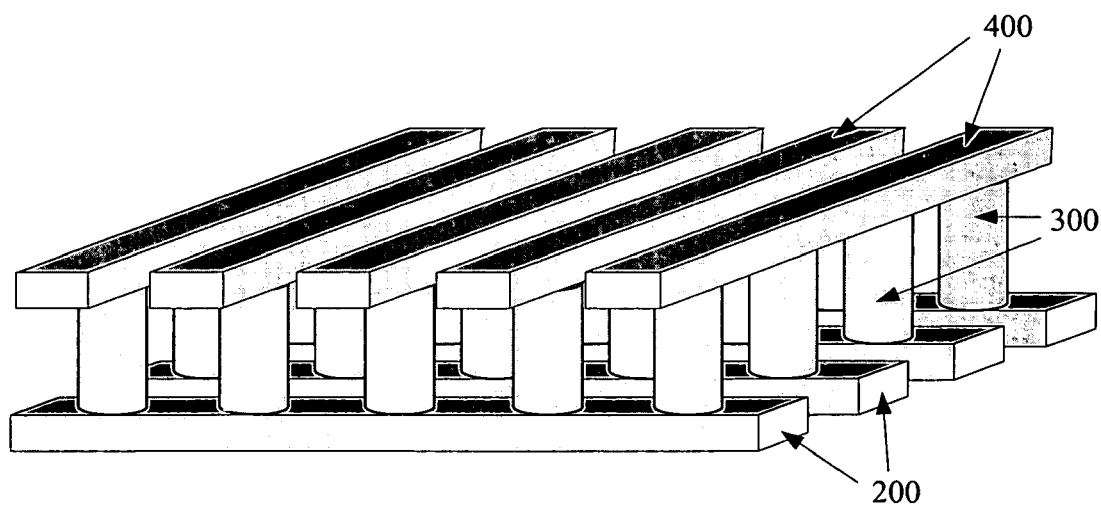
FIG. 2 is a perspective view of a portion of a memory level formed according to embodiments of the '470 application and the present invention.

The '470 application describes formation of a monolithic three dimensional memory array comprising memory cells like those shown in FIG. 1. A bottom conductor 12 is formed of a conductive material, for example tungsten, and extends in a first direction. Barrier layer 13 is formed between bottom conductor 12 and polycrystalline semiconductor diode 2. Diode 2 is a p-i-n diode having a bottom heavily doped n-type region 4; an intrinsic region 6, which is not intentionally doped; and a top heavily doped region 8. Top conductor 14 may be formed in the same manner and of the same materials as bottom conductor 12, and extends in a second direction different from the first direction. Polycrystalline semiconductor diode 2 is vertically disposed between bottom conductor 12 and top conductor 14. This memory cell can be formed above a substrate, for example above a monocrystalline silicon wafer. FIG. 2 illustrates a portion of a memory level comprising memory cells like those of FIG. 1, having bottom conductors 200, diodes 300, and top conductors 400.

The memory cell of FIG. 1 is formed in a relatively high-resistance state. When a sufficiently large programming voltage is applied, the semiconductor material forming polycrystalline semiconductor diode 2 is permanently changed to a lower-resistance state. The change in resistivity is believed to be due to an increase in the order of the polycrystalline material, as described in Herner et al., U.S.

patent application Ser. No. 11/148,530, "Nonvolatile Memory Cell Operating by Increasing Order in Polycrystalline Semiconductor Material," filed Jun. 8, 2005, and hereby incorporated by reference. In some embodiments, a dielectric rupture antifuse may be formed in series with the diode.

Figure 3A:
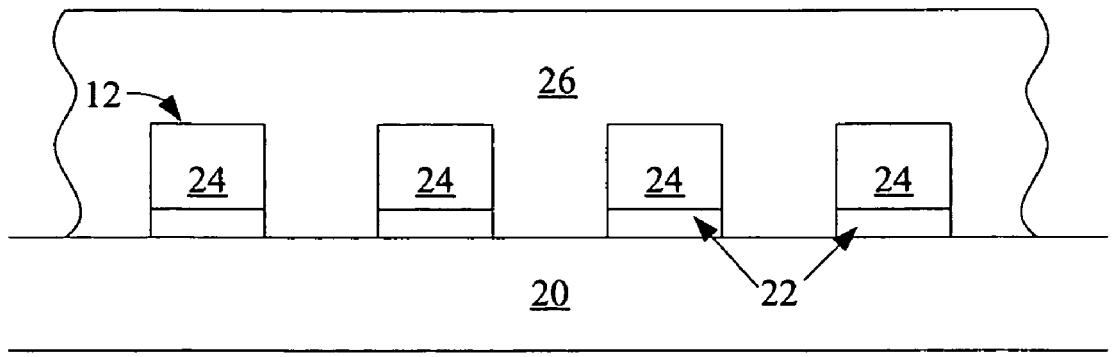
FIGS. 3a-3e are cross-sectional views illustrating stages in formation of a memory level formed according to embodiments of the '470 application, and showing formation of recesses.

Turning to FIG. 3a, in preferred embodiments of the '470 application, bottom conductors 12 are formed over a dielectric material 20 by depositing an adhesion layer 22 of titanium nitride and a tungsten layer 24. These layers are then patterned and etched, using conventional photolithography techniques, into substantially parallel conductors, shown in cross-section in FIG. 3a. Next a dielectric material 26, typically silicon dioxide, is deposited over and between conductors 12, filling gaps between them.

Figure 3B:
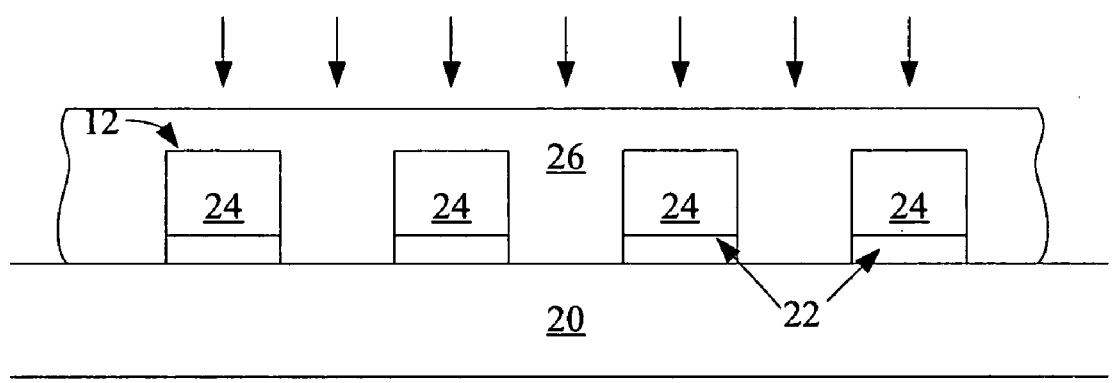
Figure 3C:
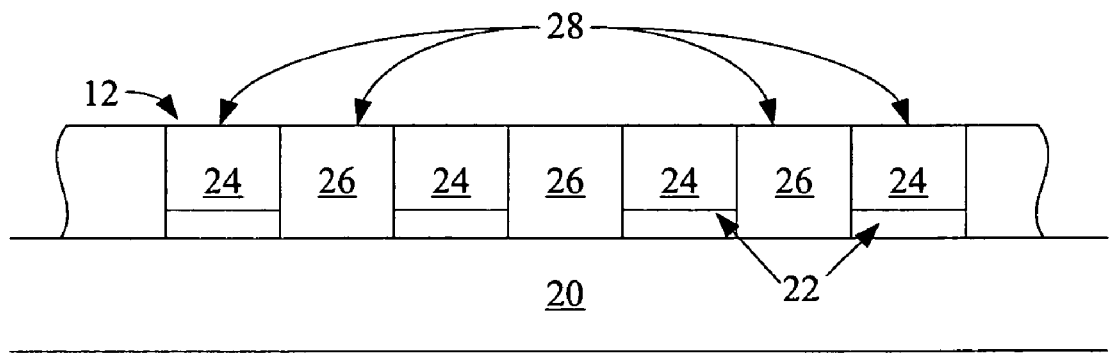

Turning to FIG. 3b, a planarization step, for example by chemical mechanical planarization (CMP) is performed next to remove the overfill of dielectric 26, eventually exposing the tops of conductors 12 as in FIG. 3c, forming a substantially planar surface 28 which coexposes silicon dioxide 26 and tungsten 24. Fabrication of the memory will continue on this surface 28, and, to promote uniformity of devices, it is advantageous that this surface be as smooth as possible, without discontinuities in the form of dishing or recessing.

When the CMP process begins, in FIG. 3a, it is performed on silicon dioxide 26 only, and the planarized surface remains relatively smooth through the phase shown in FIG. 3b. Eventually, however, the CMP process will expose tungsten 24. The removal rate of tungsten and silicon dioxide during CMP in a CMP process adapted to remove silicon dioxide is very different; i.e. the CMP process will remove silicon dioxide much faster than it removes tungsten.

Deposition, lithography, and planarization processes are all subject to variations across the wafer. Thus when tungsten 24 is first exposed at one point on the wafer, it will still be covered with silicon dioxide 26 at other points. For good electrical contact, the top of tungsten layer 24 must be entirely exposed, so CMP must be continued even after the first exposure of tungsten layer 24.

Figure 3D:
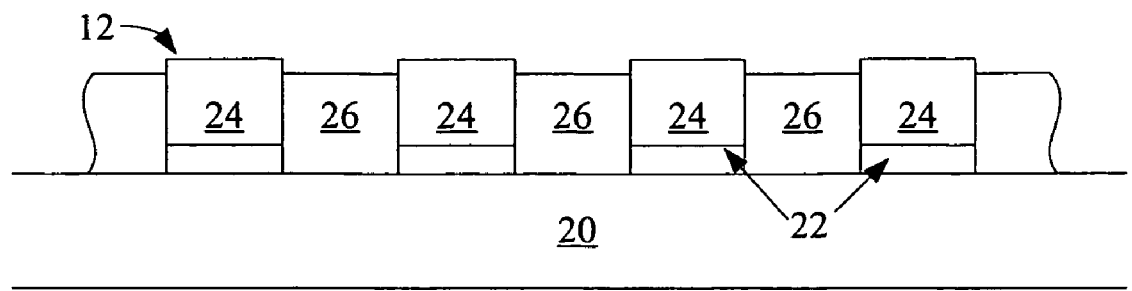

During continued CMP, more silicon dioxide 26 is removed, while virtually no tungsten 24 is removed. At many points on the wafer, silicon dioxide 26 becomes recessed relative to tungsten 24, as shown in FIG. 3d.

Figure 3E:
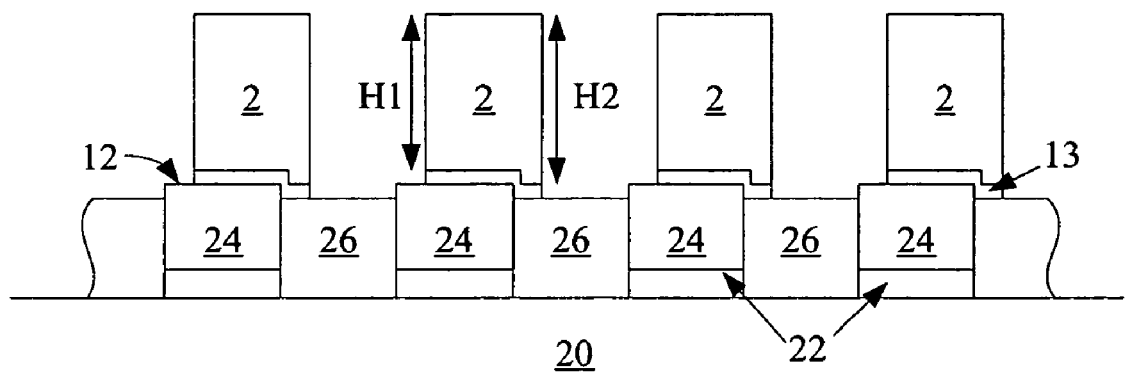

Recessing of silicon dioxide is disadvantageous: As shown in FIG. 3e, when the barrier layer 13 and diode 2 are formed in subsequent steps, the height H1 on one side and the height H2 on the other side of diode 2 will be inconsistent when some misalignment occurs, leading to nonuniformity in device performance.

If tungsten layer 24 is replaced with a different material, different problems may emerge. For example, if layer 24 is formed of aluminum, then when CMP exposes the tops of conductors 12, the CMP process tends to cause surface damage to the aluminum 24. The damaged aluminum 24 may be very rough after the CMP step is completed.

In general, then, a problem arises when CMP is performed at a surface coexposing a first material and a second material having very different CMP removal rates or characteristics when it is desired that the planarized surface be smooth, with neither material dished, recessed, or damaged. The present invention takes advantage of the fact that features made up of the first material are formed subtractively (by pattern and etch) to form a capping layer on the first material, where the capping layer has a CMP removal rate similar to that of the second material.

Figure 4A:
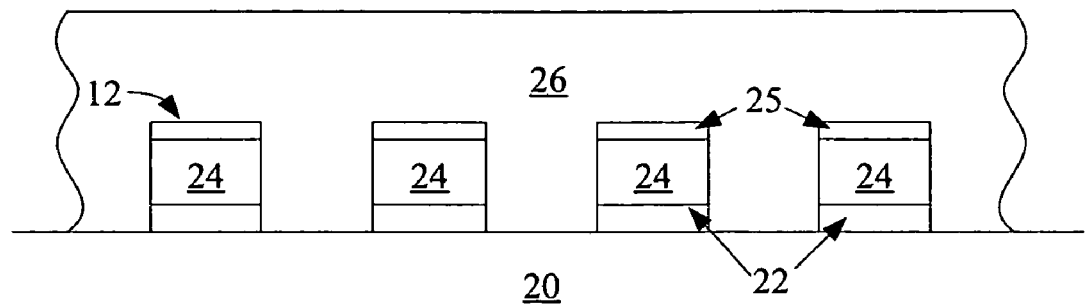
FIGS. 4a-4c are cross-sectional views illustrating stages in formation of a memory level formed according to embodiments of the present invention.
Figure 4B:
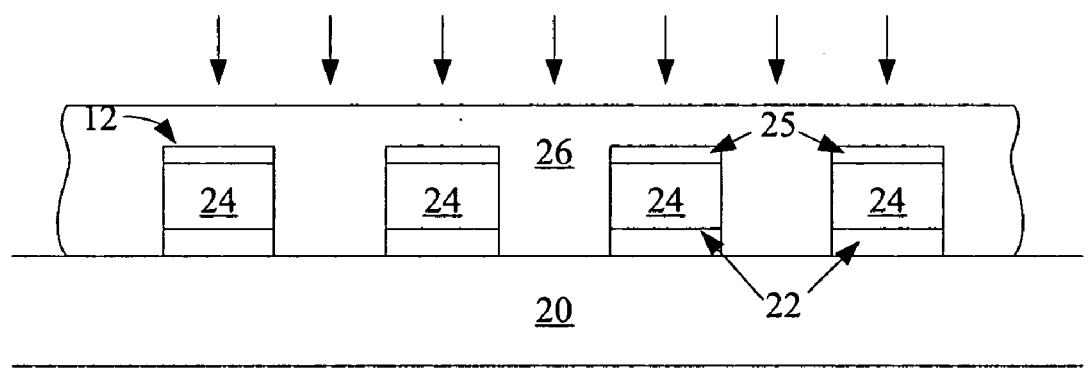
Figure 4C:
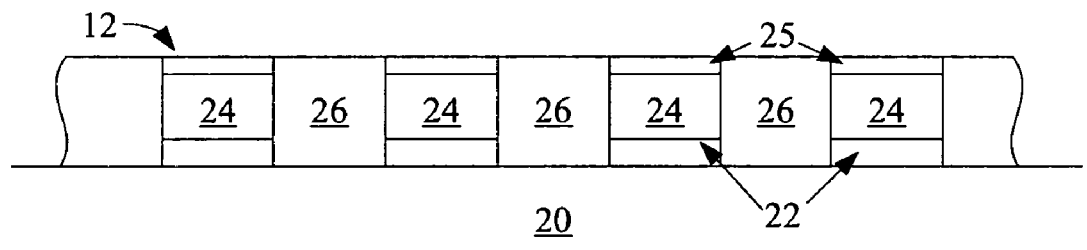

For example, turning to FIG. 4a, suppose after deposition of tungsten (or aluminum) layer 24, layer 25 of titanium nitride is deposited. Layer 25 may be deposited directly on layer 24, or there may be an intervening layer. Conductors 12 are patterned and etched, and silicon dioxide 26 is deposited over and between them, filling gaps. In FIG. 4b (as in FIG. 3b), CMP removes the overfill of silicon dioxide 26, and, in FIG. 4c, tops of conductors 12 are exposed.

This time, however, it is titanium nitride capping layer 25 that is coexposed with silicon dioxide 26 rather than tungsten or aluminum 24. As noted, the removal rate of tungsten is much slower than that of silicon dioxide, while that of aluminum is much faster. The CMP removal rate of titanium nitride, however, is very similar to that of silicon dioxide. Planarization by CMP can be continued to fully expose tops of conductors 12 without substantially recessing either silicon dioxide or the conductors.

Titanium nitride; which was used in this example for capping layer 25, was selected because it shares the trait of being highly conductive with layer 24 (tungsten or aluminum) and also shares a similar removal rate with dielectric 26. Electrical contact must be made with tops of conductors 12, so this embodiment requires capping layer 25 to be conductive. Other materials meeting these criteria could be selected. For example, materials having a CMP removal rate between about 50 percent and about 150 percent of the CMP removal rate of the dielectric 26 are preferably selected.

Alternatively, conductor 12 could be formed entirely of capping material titanium nitride. In general, though, other materials like tungsten and aluminum are preferred to form the bulk of conductors 12 because of their lower sheet resistance.

Aspects of the present invention, then, include a method for planarizing a surface, the method comprising: depositing a first conductive material (tungsten, for example); depositing a second conductive material on the first material, such as titanium nitride; patterning and etching the second and first materials to form patterned features, like the conductors; depositing a dielectric material, such as silicon dioxide, over and between the patterned features; and polishing by a CMP process to coexpose the second conductive material and the dielectric material at the planarized surface, the CMP process adapted to remove the dielectric material. The difference between the dielectric CMP removal rate and the removal rate of the second conductive material is small.

Figure 5A:
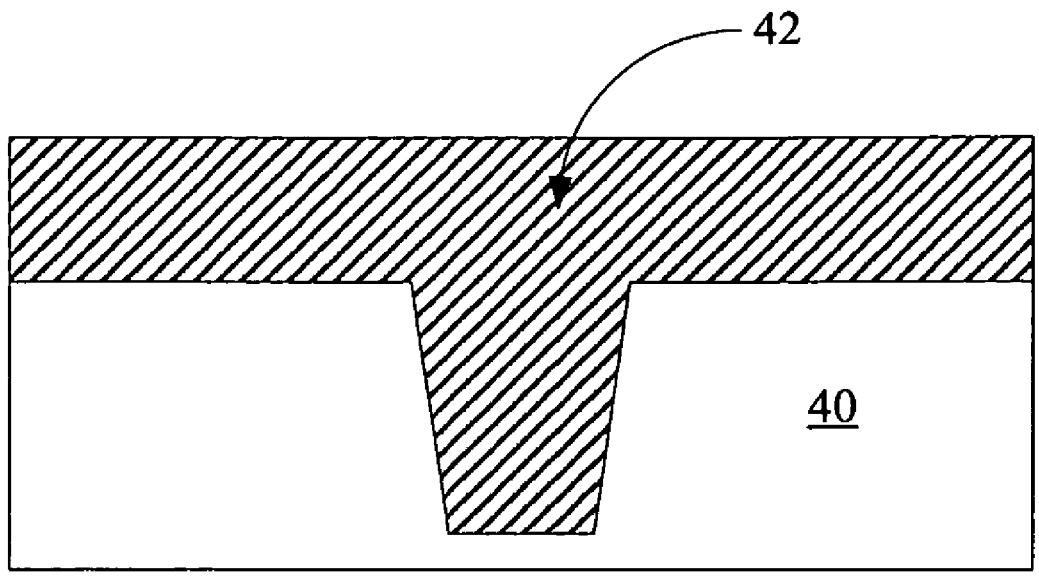
FIGS. 5a and 5b are cross-sectional views illustrating prior art Damascene construction.
Figure 5B:
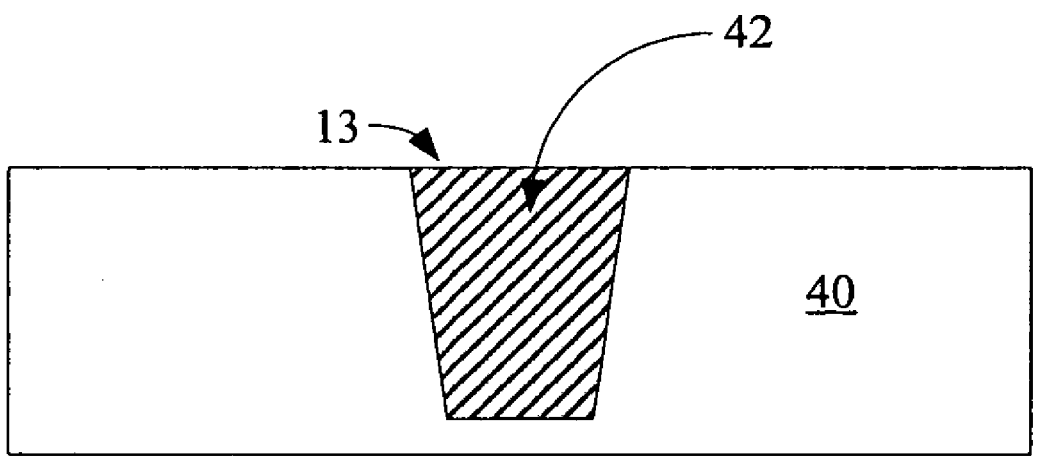

Patterned features are features formed by photolithography and etch. It will be understood that this solution is uniquely well-suited to planarization of conductive patterned features formed by a subtractive method, rather than a Damascene method. In Damascene construction, shown in FIG. 5a, a dielectric layer 40 is deposited first, then a trench formed in dielectric 40. Next a conductive material, for example a metal 42, is deposited, covering dielectric 40 and filling the trench. Turning to FIG. 5b, a CMP step removes overfill of metal 42, forming a conductor 13.

Clearly in this method of construction, it is not easily achievable for a capping layer of a different conductive material, having a CMP removal rate similar to that of dielectric 40, to be selectively present at the tops of what will be conductors 13 before the CMP step begins. In the subtractive method illustrated in FIGS. 4a-4b, however, capping layer 25 can easily be formed at the tops of conductors 12 before the CMP of silicon dioxide 26 begins.

A detailed example will be provided describing formation of a monolithic three dimensional memory array using methods according to the present invention. Details provided in the '470 and '606 applications may be useful when forming such a memory array. To avoid obscuring the invention, not all details from these applications will be provided, but it will be understood that no information from these applications is intended to be excluded.

EXAMPLE

Figure 6A:
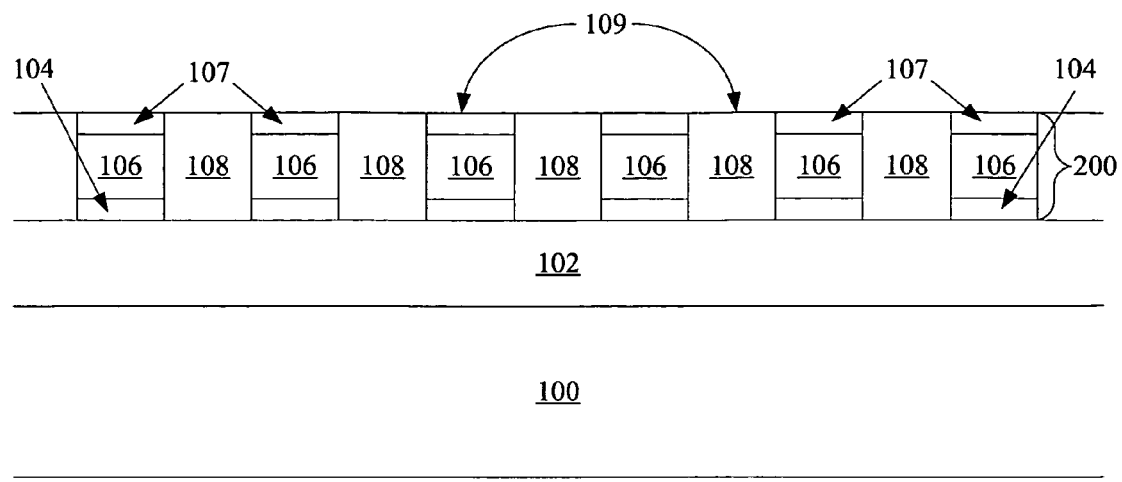
FIGS. 6a-6c are cross-sectional views illustrating stages in formation of a memory level formed according to an embodiment of the present invention.

Fabrication of a single memory level will be described in detail. Additional memory levels can be stacked, each monolithically formed above the one below it. Turning to FIG. 6a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. If the overlying conducting layer is tungsten, titanium nitride is preferred as adhesion layer 104.

The next layer to be deposited is conducting layer 106. Conducting layer 106 can comprise any conducting material known in the art, such as tungsten.

A capping layer 107 is deposited on conductive layer 106. Capping layer 107 is preferably titanium nitride, and may have a thickness between about 100 and about 800 angstroms, preferably between about 200 and about 500 angstroms thick, most preferably about 500 angstroms. Capping layer 107 is preferably no more than about 800 angstroms thick.

Layers 107, 106, and 104 will be patterned and etched using any suitable masking and etching process to form substantially parallel, substantially coplanar conductors 200, shown in FIG. 6a in cross-section. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as an oxide, nitride, oxynitride. In a preferred embodiment, silicon dioxide is used as dielectric material 108.

Finally, excess dielectric material 108 on top of conductor rails 200 is removed by CMP, exposing the tops of conductor rails 200 separated by dielectric material 108, and leaving a substantially planar surface 109. The top surfaces of conductor rails 200 will likely be primarily capping layer 107 as shown, though in some areas tungsten layer 106 may be exposed.

Figure 7A:
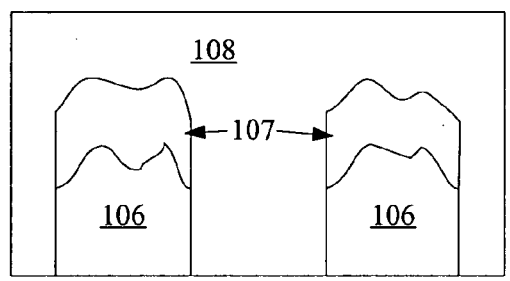
FIGS. 7a and 7b are detailed cross-sectional views illustrating stages in formation of a memory level formed according to an embodiment of the present invention.
Figure 7B:
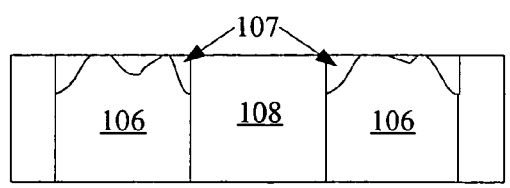

FIG. 6a is a simplified depiction of tungsten 106 capped with titanium nitride 107. FIG. 7a shows a more detailed view. Tungsten 106 deposited by chemical vapor deposition is typically large-grained, with a rough surface. Titanium nitride 107 fills in between these grains. Before CMP, tungsten 106 and titanium nitride 107 are covered by dielectric 108. FIG. 7b shows the surface after CMP, when CMP of titanium nitride 107 has formed a smooth surface and tungsten 106 may be exposed in some areas. At this stage, a plurality of substantially parallel first conductors have been formed at a first height above substrate 100.

Figure 6B:
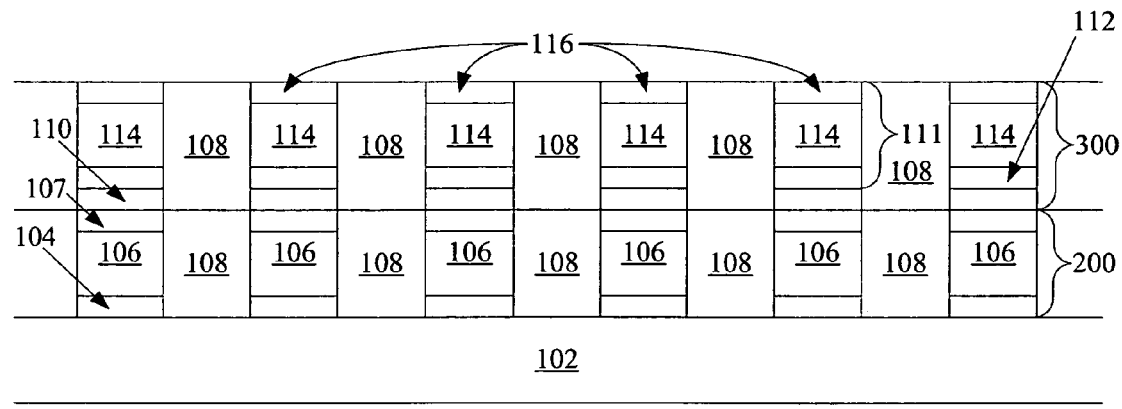

Next, turning to FIG. 6b, vertical pillars will be formed above completed conductor rails 200. (To save space substrate 100 is not shown in FIG. 6b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer.

The purpose of barrier layer 110 is to prevent interaction between the material of conductive layer 106 and the semiconductor material to be deposited next. If conductive layer 106 is tungsten, for example, and the semiconductor material to be used is silicon, a barrier is required between these materials to prevent formation of tungsten silicide. If capping layer 107 was relatively thin, tungsten 106 may have been exposed in some areas during CMP; thus formation of barrier layer 110 assures that tungsten 26 and silicon will not be in contact. If capping layer 107 was sufficiently thick to guarantee that some thickness remains at every point, with no exposure of tungsten 106, barrier layer 110 may not be necessary. The thickness of barrier layer 110 may be between about 20 and about 200 angstroms, for example about 50 angstroms.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

Figure 8A:
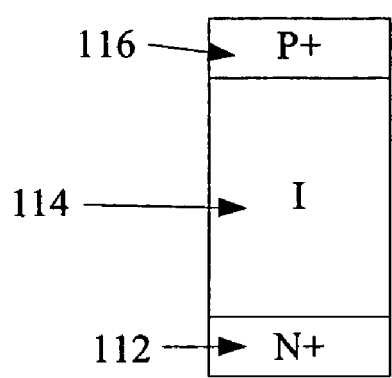
FIGS. 8a and 8b are cross-sectional views illustrating different diode configurations in an embodiment of the present invention.

In preferred embodiments, the pillar comprises a semiconductor junction diode. Turning to FIG. 8a, a preferred junction diode has a bottom heavily doped region 112, intrinsic region 114, and top heavily doped region 116. The conductivity type of bottom region 112 and top region 116 are opposite: Either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped.

Figure 8B:
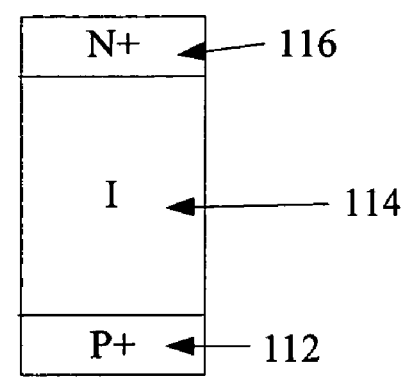

In FIG. 8a, and in the exemplary array, bottom region 112 will be n-type while top region 116 is p-type. It will be understood that these conductivity types could be reversed, as in FIG. 8b. To form the diode of FIG. 8a, returning to FIG. 6b, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3800 angstrom, preferably about 2600 angstroms.

Returning to FIG. 6b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728436, "Photomask Features with Interior Nonprinting Window Using Alternating Phase Shifting," filed Dec. 5, 2003; or Chen, U.S. application Ser. No. 10/815312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. This implant step completes formation of diodes 111. After formation of the memory array is complete, the semiconductor of diodes 111 is preferably polycrystalline. The resulting structure is shown in FIG. 6b.

Figure 6C:
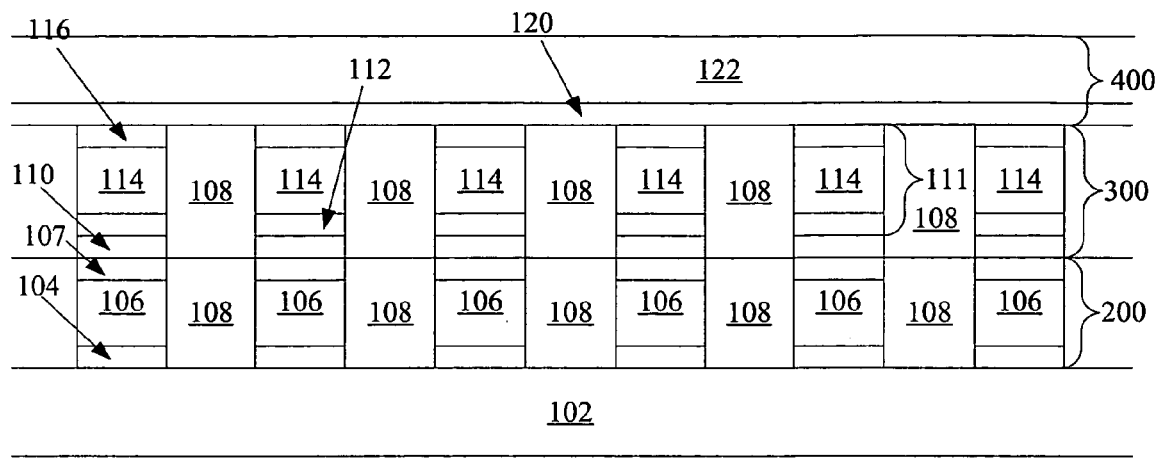

Turning to FIG. 6c, top conductors 400 can be formed in the same manner as bottom conductors 200, for example by depositing adhesion layer 120, preferably of titanium nitride and conductive layer 122, preferably of tungsten. Conductive layer 122 and adhesion layer 120 are then patterned and etched using any suitable masking and etching technique to form substantially parallel, substantially coplanar conductors 400, shown in FIG. 6c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 6c, its surface planarized, and construction of a second memory level begins on this planarized interlevel dielectric, with no shared conductors. If conductors 400 are to be shared between memory levels, a titanium nitride capping layer is preferably formed on tungsten layer 122 before etching of conductors 400.

To summarize, aspects of the invention provide for a method for forming a surface coexposing patterned features and dielectric material, the method comprising: forming first features of a first conductive material and a conductive capping material on the first conductive material; forming dielectric fill between the first features; and polishing by CMP to coexpose the dielectric fill and the conductive capping material, wherein during the polishing step the first conductive material has a lower removal rate than the conductive capping material. The first features are formed by depositing the first conductive material; depositing the conductive capping material on the first conductive material; and patterning and etching the first conductive material and the conductive capping material to form the first features.

The '606 application describes a monolithic three dimensional memory array that can be fabricated at low temperature. In embodiments of the '606 application, conductive layer 106 of conductors 200 are formed of aluminum or an aluminum alloy rather than tungsten with a titanium nitride capping layer. Aluminum has a relatively low melting point, and will deform at temperatures required to deposit and crystallize silicon. Thus in the '606 application the semiconductor diode is preferably formed of germanium or a germanium-rich semiconductor alloy. Germanium can be deposited and crystallized at temperatures lower than those required for silicon. During formation of such a memory, a surface can be planarized using a method according to an embodiment of the present invention, the method comprising: depositing aluminum or an aluminum alloy; depositing a second conductive material on the aluminum or aluminum alloy; patterning and etching the second conductive material and the aluminum or aluminum alloy to form patterned features; depositing a dielectric material over and between the patterned features; and polishing by a CMP process to coexpose the second conductive material and the dielectric material at a planarized surface, the CMP process adapted to remove the dielectric material, wherein, during the polishing step, a removal rate of the second conductive material is between 50 percent and 150 percent of a removal rate of the dielectric fill. The second conductive material may be, for example, titanium nitride.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The examples provided described an array in which a memory cell comprising a semiconductor junction diode was formed above a planarized surface formed according to the present invention. In this example, the patterned features were formed of either tungsten or aluminum capped with titanium nitride, and were in the form of rail-shaped conductors. The utility of the present invention, however, is in no way limited to memory, to monolithic three dimensional stacked structures, to rail-shaped patterned features, or to the specific materials mentioned. Conductors could be metals, conductive silicides or nitrides, metal compounds or alloys, or other materials. Dielectrics could be any oxides, nitrides, or other dielectrics conventionally used in semiconductor processing. Patterned features could take any shape. It will be apparent to those skilled in the art that the methods of the present invention can be advantageous in any instance in which a planarized surface is formed coexposing materials having very different CMP removal rates, when it is desired that the planarized surface is smooth, with minimal recessing or dishing.

The methods of the present invention could advantageously be used in related memories, for example in Herner et al., U.S. patent application Ser. No. 11/015,824, "Nonvolatile Memory Cell Comprising a Reduced Height Vertical Diode," filed Dec. 17, 2004; and in Herner et al., U.S. patent application Ser. No. 11/125,939, "Rewriteable Memory Cell Comprising a Diode and a Resistance-Switching Material," filed May 9, 2005, both assigned to the assignee of the present invention and hereby incorporated by reference.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for planarizing a surface, the method comprising:
   depositing aluminum or an aluminum alloy;
   depositing a second conductive material on and in contact with the aluminum or aluminum alloy;
   patterning and etching the second conductive material and the aluminum or aluminum alloy to form patterned features;
   depositing a dielectric material over and between the patterned features; and
   polishing by a CMP process to coexpose the second conductive material and the dielectric material at a planarized surface, the CMP process adapted to remove the dielectric material,
   wherein, during the polishing step, a removal rate of the second conductive material is between 50 percent and 150 percent of a removal rate of the dielectric fill.

2. The method of claim 1 wherein the dielectric material is an oxide, nitride, or oxynitride.

3. The method of claim 2 wherein the dielectric material is silicon dioxide.

4. The method of claim 1 wherein the second conductive material is titanium nitride.

5. The method of claim 1 wherein the features are substantially parallel rails.

6. The method of claim 5 wherein the parallel rails are conductors in a first memory level formed above a substrate.

7. The method of claim 6 wherein at least a second memory level is monolithically formed above the first.

8. The method of claim 1 wherein the second conductive material is deposited directly on the first conductive material.

9. The method of claim 8 wherein the second conductive material is no more than about 800 angstroms thick.

10. A method for forming a surface coexposing patterned features and dielectric material, the method comprising:
    forming first features of a first conductive material and a conductive capping material on and in contact with the first conductive material;
    forming dielectric fill between the first features; and
    polishing by CMP to coexpose the dielectric fill and the conductive capping material,
    wherein, during the polishing step the first conductive material has a lower removal rate than the conductive capping material,
    wherein the first conductive material is tungsten.

11. The method of claim 10 wherein the conductive capping material is titanium nitride.

12. The method of claim 10 wherein the dielectric fill is an oxide, nitride, or oxynitride.

13. The method of claim 12 wherein the dielectric fill is silicon dioxide.

14. The method of claim 10 wherein the first features comprise a first plurality of substantially parallel rails.

15. The method of claim 14 wherein the rails are conductors within a first memory level formed above a substrate.

16. The method of claim 15 wherein at least a second memory level is monolithically formed above the first memory level in a monolithic three dimensional memory array.

17. The method of claim 10 wherein, during the polishing step, a removal rate of the conductive capping material is between 50 percent and 150 percent of a removal rate of the dielectric fill.

18. The method of claim 10 wherein the step of forming the first features comprises:
    depositing the first conductive material;
    depositing the conductive capping material on the first conductive material; and
    patterning and etching the first conductive material and the conductive capping material to form the first features.

19. The method of claim 18 wherein the conductive capping material is deposited directly on the first conductive material.

* * * * *